(12) United States Patent
Cedergren et al.

(10) Patent No.: US 7,727,592 B2
(45) Date of Patent: Jun. 1, 2010

(54) COATED INSERT

(75) Inventors: Gunilla Cedergren, Sandviken (SE);
Mikael Lindholm, Varby (SE);
Ann-Britt Ljungberg, Stockholm (SE);
Mikael Lagerquist, Vasby (SE); Frida Cullin, Gavie (SE)

(73) Assignee: Sandvik Intellectual Property AB, Sandviken (SE)

( * ) Notice: Subject to any disclaimer, the term of this patent is extended or adjusted under 35 U.S.C. 154(b) by 238 days.

(21) Appl. No.: 12/155,085

(22) Filed: May 29, 2008

(65) Prior Publication Data
US 2008/0286462 A1   Nov. 20, 2008

Related U.S. Application Data

(62) Division of application No. 11/165,354, filed on Jun. 24, 2005, now Pat. No. 7,396,371.

(30) Foreign Application Priority Data

Jun. 24, 2004   (SE)   ..................................... 0401636
Jun. 24, 2004   (SE)   ..................................... 0401637

(51) Int. Cl.
*C23C 30/00*   (2006.01)
(52) U.S. Cl. ..................... 427/299; 427/331; 427/419.1; 427/419.2; 427/419.7
(58) Field of Classification Search ................. 427/299, 427/331, 419.1, 419.2, 419.7
See application file for complete search history.

(56) References Cited

U.S. PATENT DOCUMENTS 4,239,819 A   12/1980   Holzl (Continued)

FOREIGN PATENT DOCUMENTS

| EP | 0 127 416 | 1/1990 |
|---|---|---|
| EP | 0 693 574 B1 | 4/1998 |
| EP | 0 683 244 B1 | 10/1998 |
| EP | 0 298 729 B2 | 12/2000 |
| EP | 1 103 635 B1 | 8/2004 |
| FR | 2 096 507 | 6/1971 |
| FR | 2 243 754 | 9/1974 |
| GB | 2048960 | 12/1980 |

OTHER PUBLICATIONS

S. Ruppi et al., "Microstructure and Deposition Characteristics of κ-Al$_2$O$_3$", *J. Phys. IV France*, vol. 9, Sep. 1999, pp. Pr-349 to Pr-355.

*Primary Examiner*—Archene Turner
(74) *Attorney, Agent, or Firm*—Drinker Biddle & Reath LLP

(57) ABSTRACT

The present invention relates to a cutting insert particularly for turning of stainless steel comprising a cemented carbide substrate and a post-treated coating with a substrate of cemented carbide having a composition of from about 5.0 to less than about 8.0 wt % Co, from about 3.0 to about 8.0 wt % cubic carbides of the metals Ti, Ta and Nb with a Ti/(Ti+Ta+Nb) ratio of from about 0.05 to about 0.3 and balance tungsten carbide (WC) having a grain size of from about 1.5 to about 3.5 μm in the as-sintered state. Further, the substrate has a surface zone of from about 5 to about 30 μm characterized by an enrichment of binder phase and a depletion of cubic carbides, and a coating having a first, innermost layer system of one or several layers of TiC$_x$N$_y$O$_z$ with x+y+z≦1 with a total thickness of from about 0.7 to about 5.5 μm and a second multilayer system consisting of from about 5 to about 31 alternating layers of Al$_2$O$_3$ and TiC$_x$N$_y$O$_z$ (x+y+z≦1), preferably κ-Al$_2$O$_3$ and TiN, the Al$_2$O$_3$-layers having an individual layer thickness of less than about 0.5 μm and the TiC$_x$N$_y$O$_z$-layers less than about 0.2 μm with a total thickness of the multilayer of from about 1.0 to about 5.0 μm. The multilayer is exposed along the edge line and into the rake and flank face. In an alternative embodiment the multilayer is replaced by an Al$_2$O$_3$-layer.

8 Claims, 3 Drawing Sheets

U.S. PATENT DOCUMENTS

| | | |
|---|---|---|
| 4,643,620 A | 2/1987 | Fujii et al. |
| 4,984,940 A | 1/1991 | Bryant et al. |
| 5,700,569 A | 12/1997 | Ruppi |
| 5,786,069 A | 7/1998 | Ljungberg et al. |
| 6,344,264 B1 | 2/2002 | Lenander et al. |
| 6,632,514 B1 | 10/2003 | Sulin et al. |
| 7,090,914 B2 | 8/2006 | Yamagata et al. |
| 7,153,562 B2 | 12/2006 | Rodmar et al. |
| 7,192,637 B2 | 3/2007 | Ruppu et al. |
| 2004/0180241 A1 | 9/2004 | Rodmar et al. |

COATED INSERT

This is a divisional application of application Ser. No. 11/165,354, filed on Jun. 24, 2005, now U.S. Pat. No. 7,396,371 which is incorporated by reference herein in its entirety, and also claims the benefit under 35 U.S.C. §119 to application SE 0401636-6 filed in Sweden on Jun. 24, 2004 and to application SE 0401637-4 filed in Sweden on Jun. 24, 2004.

BACKGROUND OF THE INVENTION

The present invention pertains to a coated cemented carbide metal cutting tool for the machining of steels in general when a high wear resistance as well as a large toughness behaviour of the cutting edge are required. The tool is particularly suitable for turning of stainless steels.

When cemented carbide cutting tools are used in the machining of steels, the tool is worn by different mechanisms such as abrasive and chemical wear, chipping and fracturing of the cutting edge. For a coated tool normally having thin surface layers of wear resistant carbide, nitride, carbonitride and/or oxide compounds formed by various vapor deposition techniques, the coating contributes to increase the abrasive wear resistance. But it also acts as a thermal barrier for the diffusion of heat from the cutting surface into the underlying cemented carbide substrate. A high temperature within the edge region in combination with high cutting forces result in an increase of the creep deformation within the affected surface region of the substrate and the cutting edge deforms plastically.

The cutting of stainless steel is considered to be a particularly difficult machining operation since in addition to the above mentioned wear mechanisms, adhesive wear and plastic deformation are also prominent factors. Adhesive wear occurs when smearing materials like stainless steels during the cutting operation continuously adhere to and tear off material from the cutting edge. A short tool life is therefore very frequent when machining stainless steels. Furthermore, austenitic and so called duplex stainless steels exhibit strong deformation hardening which results in high contact forces, e.g., between the chip and the surface of the tool. When cutting such workpiece materials at high cutting speeds, considerable thermal energy is transferred to the cutting edge and, in combination with the high cutting forces, the tool edge may partly or entirely deform plastically. Deformation of the edge, which is mainly controlled by the properties of the surface region of the substrate, results in larger cutting forces and thus a reduced tool life. A large requirement of plastic deformation resistance is in clear contrast to a large requirement of edge toughness.

Edge toughness is also required in order to withstand mechanically induced damage of the edge outside the direct area of contact between the tool and the workpiece. This will reduce the number of edges to be used on the insert and, accordingly, the productivity of the tool. Damages of this kind, normally denoted chip hammering and chip jamming, may partly or wholly be avoided by selecting a proper microgeometry of the active edge surfaces of the insert but in several cases this possibility is not enough. U.S. Pat. No. 5,786,069 describes a coated turning insert suitable for turning of forged components of stainless steel. The insert has a cemented carbide substrate containing 2-10 wt-% cubic carbides of groups IVb, Vb and/or VIb of the periodic table (γ-phase), 5-11 wt-% cobalt binder and balance tungsten carbide (WC). The substrate has a highly tungsten alloyed binder phase and in one embodiment the as-sintered microstructure exhibits a 15-35 μm deep Co enriched surface zone free of γ-phase. The coating consists of an inner layer of Ti(C,N,O) with columnar grains and a top layer of finely grained κ-$Al_2O_3$. However, regarding the cemented carbide substrate, the combination of a high nominal content of binder phase and a thick γ-phase depleted surface zone followed by a zone characterized by a high concentration peak of γ-phase, all in relative terms, does not favor the resistance against plastic deformation. This will result in rapid wear and short tool life for machining austenitic and duplex stainless steels at high cutting speeds.

Multilayer coatings comprising first and second layers of different materials which are alternately laminated on the substrate, each of the first layers having a first thickness and each of the second layers having a second thickness are known. The two layers should preferably have a different crystal structure and/or at least different lattice spacings. One example is when the $Al_2O_3$ growth periodically is interrupted by a short TiN deposition process resulting in an $(Al_2O_3+TiN)_n$ multilayer structure see, e.g., Proceedings of the 12:th European CVD Conference page pr.8-349. GB 2048960A discloses a multilayer coating with a multiplicity of alternating layers of 0.02 to 0.1 μm consisting of hard material of different compositions. In U.S. Pat. No. 4,984,940, Bryant et al. disclose a cutting insert composed of a cemented carbide substrate with 6.1-6.5 wt % cobalt, a coating including a base layer of titanium carbonitride followed by a multilayered coating. Said coating consists of a plurality of alumina layers separated from and bonded to each other by a group IVb metal nitride, such as titanium nitride.

A cemented carbide substrate with a coating comprising 6-8 alumina layers is also claimed in U.S. Pat. No. 5,700,569. EP-A-1103635 describes a cutting tool consisting of a cemented carbide substrate with 9.0-10.9 wt % cobalt and a coating comprising a medium temperature CVD (MTCVD) deposited TiCN-layer and a multilayer composed of totally 741 layers of α-$Al_2O_3$ and TiN or Ti(C,N).

Smoothing of coatings by mechanical post treatment in order to e g minimize the friction between the tool and the workpiece is disclosed in EP-A-127416, EP-A-298729, EP-A-693574 and EP-A-683244.

US-A-2004180241 describes a coated cemented carbide cutting tool insert with large requirements on wear resistance and toughness behaviour of the cutting edge particularly suitable for general turning of stainless steels. In one embodiment, the substrate has a γ-phase depleted and binder phase enriched surface zone down to a depth of 5 to 50 μm. The composition of the substrate is 7.0 to 10.5 wt-% Co, 4.0 to 9.0 wt-% cubic carbides of elements from group IVb, Vb or VIb of the periodic table preferably Nb, Ta and/or Ti, a nitrogen content of 0.01 to 0.2 wt-% and balance tungsten carbide, WC. The coating contains an innermost layer system of up to three layers of $TiC_xN_yO_z$ (x+y+z≦1), a second multilayer system comprising 5 to 31 alternating layers of $Al_2O_3$ and $TiC_xN_yO_z$ (x+y+z≦1), preferably 11 to 15 alternating layers of κ-$Al_2O_3$ and TiN, and an outermost layer system comprising one or more layers of $TiC_xN_y$ (x+y≦1) or three layers in sequence TiN—TiC—TiN or combinations thereof. Further, the outermost surfaces of the coated insert are mechanically post-treated so that the multilayer and partly the innermost layer system is exposed along the edge line.

In view of the state of the art there is a need for a cutting tool insert for machining steels at high speeds in general and stainless steels in particular. This refers especially to a cutting insert which exhibits an improved resistance against abrasive and adhesive wear, plastic deformation, chip hammering and chip jamming damages.

OBJECTS AND SUMMARY OF THE INVENTION

It is an object of the present invention to provide a cutting tool insert able to simultaneously withstand all the above mentioned wear modes.

It is a further object of the present invention to avoid or alleviate problems associated with prior art tool products and to provide a high performance tool for high cutting speeds.

It is a still further object of the present invention to provide a tool with excellent cutting performance in demanding stainless steel turning operations.

In accordance with the invention, there is provided a substrate of cemented carbide having a composition comprising from about 5.0 to less than about 8.0 wt % Co, from about 3.0 to about 8.0 wt % cubic carbides of the metals Ti, Ta and Nb and possibly other carbides of the elements from group IVb, Vb or VIb of the periodic table, the addition of cubic carbide forming elements being such that the Ti/(Ti+Ta+Nb) ratio is from about 0.05 to about 0.3, from about 0.01 to about 0.2 wt % N and balance tungsten carbide (WC) having a grain size of from about 1.5 to about 3.5 μm in the as-sintered state and having a γ-phase depleted and binder phase enriched surface zone which has a depth of from about 5 to about 30 μm, and a coating having a first, innermost layer system of at least two layers of $TiC_xN_yO_z$ with $x+y+z \leq 1$; and the same coating having a second multilayer system comprising from about 5 to about 31 alternating layers of $Al_2O_3$ and $TiC_xN_yO_z$ ($x+y+z \leq 1$), the $Al_2O_3$-layers having an individual layer thickness of less than about 0.6 μm and the $TiC_xN_yO_z$-layers from about 0.01 to about 0.2 μm with a total thickness of the multilayer from about 1.0 to about 5.0 μm, said multilayer being exposed along the edge line and into the rake and flank face, such that the exposure on the rake face a is greater than about 0.03 and less than about 0.9 mm, the exposure on the flank face b is greater than about 0.02 and less than about 0.2 mm and a>b.

BRIEF DESCRIPTION OF THE FIGURES

FIG. 2.1 is a schematic of the cross-section of the edge without a post-treatment.

FIG. 2.2 is a schematic of the cross-section of the edge with a post-treatment according to the invention where the outermost layer E is removed.

FIG. 2.3 is a schematic of the cross-section of the edge with a post-treatment according to the invention where the outermost layer E and the multilayer $(Al_2O_3+TiN)_x Al_2O_3$ are removed.

DETAILED DESCRIPTION OF THE PREFERRED EMBODIMENTS OF THE INVENTION

It has surprisingly been found that a cemented carbide cutting insert with a substrate containing a comparatively low content of cobalt and cubic carbides, a narrow γ-phase depleted and binder phase enriched surface zone, in combination with a coating including a mechanically post-treated multilayer consisting of a plurality of alternating $Al_2O_3$ and $TiC_xN_yO_z$-layers meets these requirements. Alternatively, the multilayer can be replaced by a mechanically post-treated α- or κ-$Al_2O_3$ layer. The insert exhibits excellent resistance against plastic deformation, high edge toughness behavior and also a sufficient resistance to adhesive wear especially during turning of austenitic and duplex stainless steels at high cutting speeds.

More specifically, the invention relates to a WC+Co-based cemented carbide substrate with additions of cubic carbides having a γ-phase depleted and binder phase enriched surface zone, a specific size range of the WC grains, a specific composition range of WC+Co, a specific Ti/(Ti+Ta+Nb) ratio and a coating on the cemented carbide substrate including an innermost layer system comprising of a thin layer of equiaxed $TiC_xN_yO_z$ followed by a layer of columnar $TiC_xN_yO_z$ and a thin layer of equiaxed $TiC_xN_yO_z$. This innermost layer system should contain at least two layers of $TiC_xN_yO_z$ with ($x+y+z \leq 1$). On this layer system, a multilayer with a periodic variation of $TiC_xN_yO_z$ and $Al_2O_3$ layers ($x+y+z \leq 1$) and an outermost layer of $TiC_xN_y$ ($x+y \leq 1$) are deposited. At least the non-oxide outermost layer in areas in direct contact with material from the work-piece around the cutting edge is missing.

Figure 1:
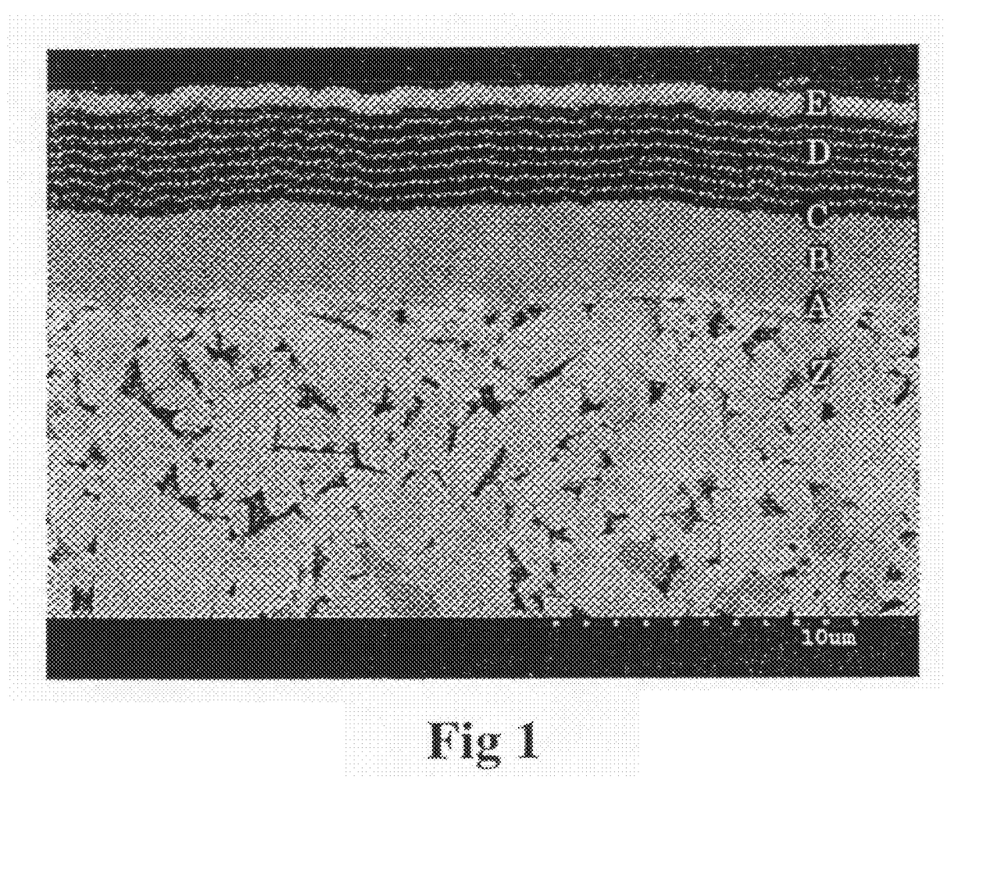
FIG. 1 is a scanning electron micrograph (SEM) of a cross-section of the surface area of the substrate and the coating according to the present invention in which:
Z.=γ-phase depleted and binder phase enriched surface zone within the substrate
A.=TiN-layer,
B.=columnar Ti(C,N)-layer,
C.=TiN-layer,
D.=multilayer $(Al_2O_3+TiN)_6 Al_2O_3$ and
E.=$TiC_xN_y$-layer.

The composition of the cemented carbide substrate should comprise from about 5.0 to less than about 8.0 wt % Co, preferably from about 5.0 to less than about 7.0 wt % Co, and from about 3.0 to about 8.0 wt % cubic carbides, preferably from about 4.0 to about 7.0 wt % cubic carbides of the metals Ti, Ta and Nb and possibly other carbides of the elements from group IVb, Vb or VIb of the periodic table and balance tungsten carbide (WC). The average grain size of the WC is from about 1.5 to about 3.5 μm, preferably from about 2.0 to about 3.0 μm. The addition of cubic carbide forming elements should be such that the Ti/(Ti+Ta+Nb) ratio is from about 0.05 to about 0.3, preferably from about 0.1 to about 0.25. The depth of zone Z should be from about 5 to about 30 μm, preferably from about 5 to about 25 μm. Said cubic carbides may contain some amounts of N and O and the amount of N should be from about 0.01 to about 0.2 wt %.

The hard and wear resistant refractory coating (FIG. 1) deposited on the cemented carbide substrate according to the present invention comprises:

a first, innermost layer (A) of $TiC_xN_yO_z$ with $x+y+z \leq 1$, preferably y>x and z<0.2, most preferably y>0.8 and z=0, with equiaxed grains with size <0.5 μm and a total thickness less than about 1.5 μm but greater than about 0.1 μm, preferably from about 0.1 to about 0.6 μm.

a second layer (B) of $TiC_xN_yO_z$ with $x+y+z \leq 1$, preferably with z=0, x>0.3 and y>0.3, most preferably x>0.5, with a thickness of from about 0.4 to about 4.9 μm, preferably from about 1.5 to about 4.0 μm with columnar grains.

a third layer (C) of $TiC_xN_yO_z$ with $x+y+z \leq 1$, preferably y>x and z<0.2, most preferably y>0.8 and z=0, with equiaxed grains with size less than about 0.5 μm and a total thickness less than about 1.5 μm but greater than about 0.1 μm, preferably from about 0.2 to about 0.8 μm.

the total thickness of the layers A+B+C is from about 0.7 to about 5.5 μm, preferably from about 1.2 to about 5.0 μm. Preferably, the layers A and C are each thinner than the layer B.

a multilayer (D) comprising a plurality of alternating $Al_2O_3$ and $TiC_xN_yO_z$ (x+y+z≦1) layers, preferably κ-$Al_2O_3$ and TiN layers. The innermost and the outermost layer of the multilayer sequence are $Al_2O_3$-layers. The total number of layers, including both the $TiC_xN_yO_z$- and $Al_2O_3$-layers, is between about 5 and about 31, preferably between about 11 and about 15 layers. The $Al_2O_3$-layers have an individual layer thickness of less than about 0.6 μm, preferably from about 0.2 to about 0.5 μm. The $TiC_xN_yO_z$-layers have an individual layer thickness of from about 0.01 to about 0.2 μm, preferably from about 0.02 to about 0.15 μm. The total thickness of the multilayer is from about 1.0 to about 5.0 μm, preferably from about 1.5 to about 4.0 μm. The grain size of each $Al_2O_3$-layer is equal to or less than the thickness of the layer.

an outermost layer system (E) comprising one or several layers in sequence of $TiC_xN_y$ (x+y≦1), preferably three to five layers in sequence of TiN, TiC, and TiN. The total thickness is less than about 2.0 μm but greater than about 0.1 μm, preferably from about 0.5 to about 1.5 μm.

the total thickness of the layers A+B+C+D+E is from about 2.0 to about 9.0 μm, preferably from about 4.0 to about 8.0 μm.

Figure 3:
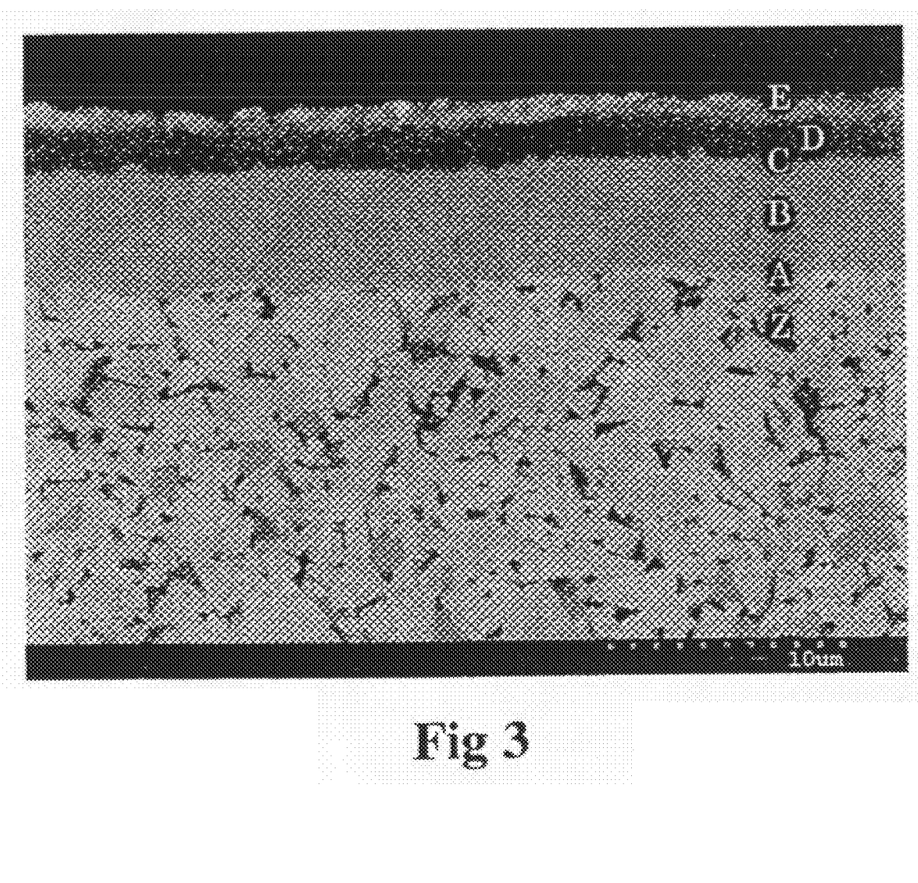
FIG. 3 is a scanning electron micrograph (SEM) of a cross-section of the surface area of the substrate and the coating according to the present invention in which:
Z.=γ-phase depleted and binder phase enriched surface zone within the substrate
A.=TiN-layer,
B.=columnar Ti(C,N)-layer,
C.=Ti(C,N)-layer,
D.=α- or κ-$Al_2O_3$ layer and
E.=$TiC_xN_y$-layer.

In an alternative embodiment, the hard and wear resistant refractory coating deposited on the cemented carbide substrate according to the present invention comprises:

a first, innermost layer (A) of $TiC_xN_yO_z$ with x+y+z≦1, preferably y>x and z<0.2, most preferably y>0.8 and z=0, with equiaxed grains with size less than about 0.5 μm and a total thickness less than about 1.5 μm but greater than about 0.1 μm, preferably from about 0.1 to about 1.2 μm.

a second layer (B) of $TiC_xN_yO_z$ with x+y+z≦1, preferably with z=0, x>0.3 and y>0.3, most preferably x>0.5, with a thickness of from about 1.0 to about 5.0 μm, preferably from about 2.0 to about 4.5 μm with columnar grains.

a third layer (C) of $TiC_xN_yO_z$ with x+y+z≦1, preferably y>x and z<0.2, most preferably y>0.8 and z=0, with equiaxed grains with size less than about 0.5 μm and a total thickness less than about 1.5 μm but greater than about 0.1 μm, preferably from about 0.2 to about 0.8 μm.

the total thickness of the layers A+B+C is from about 1.5 to about 6.5 μm, preferably from about 2.0 to about 5.5 μm. Preferably, the layers A and C are each thinner than the layer B.

an α- or κ-$Al_2O_3$ layer (D) with total thickness from about 1.5 to about 5.0 μm, preferably from about 1.5 to about 4.0 μm.

an outermost layer system (E) comprising $TiC_xN_y$ (x+y≦1) either as one homogenous layer or in form of TiN+TiC sequence. The total thickness is less than about 2.0 μm but greater than about 0.1 μm, preferably from about 0.5 to about 1.5 μm.

the total thickness of the layers A+B+C+D+E is from about 3.0 to about 11.0 μm, preferably from about 4.5 to about 9.5 μm.

Figure 22:
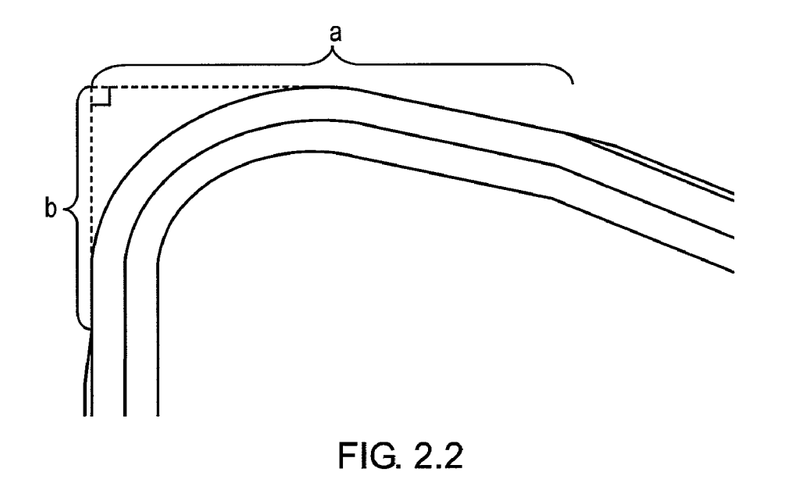

The outermost part of the coating is missing around the edge in the area corresponding to the chip contact on the rake face and the contact with the work piece on the flank face. Most preferably, the area considered corresponds to the primary land on the rake face when a primary land exists on the geometry at hand such that the coating is missing a distance from a point defined in FIG. 2.2 with a perspective perpendicular to the insert face planes on the rake face "a" and on the flank face "b". These distances depend on different insert geometries and insert sizes etc on the rake face, preferably corresponding to 0.03<a<0.9 mm and 0.02<b<0.2 mm independent of the existence of a primary land or not, a>b, preferably a>1.5b. In one embodiment, only the layer E is missing. In another embodiment, both layers D and E are missing in parts of the area.

In an alternative embodiment, the outermost layer of the coating is missing in the area corresponding to the chip contact on the rake face. The area considered is most preferably the cutting edge and the area corresponding to the primary land on the rake face when a primary land exists on the geometry. Further, the outermost layer is also missing or partly missing on the rake face.

The present invention also relates to a method of making the above mentioned coated cutting tool insert comprising preferably a cemented carbide substrate made in such a way that a cubic carbide depleted and binder phase enriched zone near the surface is obtained by sintering in vacuum after the addition of a low amount of nitrogen before coating. The composition of the cemented carbide substrate comprises from about 5.0 to about less than 8.0 wt % Co, from about 3.0 to about 8.0 wt % cubic carbides and the balance is tungsten carbide (WC). The average WC grain size is from about 1.5 to about 3.5 μm. The addition of cubic carbide forming elements should be such that the Ti/(Ti+Ta+Nb) ratio is from about 0.05 to about 0.3, preferably from about 0.1 to about 0.25. The depth of zone Z should be from about 5 to about 30 μm, preferably from about 5 to about 25 μm. Said cubic carbides may contain some amounts of N and O and the amount of N should be from about 0.01 to about 0.2 wt %. These microstructural constituents could be referred to as e.g. carbonitride or oxycarbonitride. The cemented carbide body is mainly produced by mixing of powders, ball milling, spray drying, some pressing method followed by sintering according to conventional methods and pre-treatment like edge radius forming and cleaning before coating.

The body is then coated with a first (innermost) layer (A) of $TiC_xN_yO_z$ with x+y+z≦1, preferably y>x and z<0.2, most preferably y>0.8 and z=0, with equiaxed grains with size less than about 0.5 μm and a total thickness less than about 1.5 μm but greater than about 0.1 μm using known chemical vapor deposition, CVD, methods.

a layer of $TiC_xN_yO_z$(B) with x+y+z≦1, preferably with z=0, x>0.3 and y>0.3 with a thickness of from about 0.4 to about 4.9 μm, preferably from about 1.5 to about 4.0 μm with columnar grains, using preferably a moderate temperature CVD, MTCVD, technique (using acetonitrile as the carbon and nitrogen source for forming the layer in the temperature range of from about 700 to about 900° C.). The exact conditions depend to a certain extent on the design of the equipment used.

a layer of $TiC_xN_yO_z$(C) with x+y+z≦1, preferably y>x and z<0.2, most preferably y>0.8 and z=0, with equiaxed grains with size less than about 0.5 μm and a total thickness less than about 1.5 μm but greater than about 0.1 μm using known CVD-methods. This layer (C) is as a second embodiment omitted.

The total thickness of the layers A+B+C is from about 0.7 to about 5.5 μm, preferably from about 1.2 to about 5.0 μm. Preferably, the layers A and C are each thinner than layer B.

a multilayer (D) comprising a plurality of alternating $Al_2O_3$ and $TiC_xN_yO_z$ (x+y+z≦1) layers, preferably κ-$Al_2O_3$- and TiN-layers, using known CVD-methods. The innermost and the outermost layer of the multilayer sequence are $Al_2O_3$-layers. The total number of layers, including both the $TiC_x$-

$N_yO_z$- and $Al_2O_3$-layers, is between about 5 and about 31, preferably from about 11 to about 15 layers. The $Al_2O_3$-layers have an individual layer thickness of less than about 0.6 μm, preferably from about 0.2 to about 0.5 μm. The $TiC_xN_yO_z$-layers have an individual layer thickness of from about 0.01 to about 0.2 μm, preferably from about 0.02 to about 0.15 μm. The total thickness of the multilayer is from about 1.0 to about 5.0 μm, preferably from about 1.5 to about 4.0 μm. The grain size of the $Al_2O_3$-layer is equal to or less than the thickness of the $Al_2O_3$-layer.

preferably, an outermost layer system (E) comprising one or several layers in sequence of $TiC_xN_y$ (x+y≦1), preferably three to five layers in sequence of TiN, TiC and TiN, using known CVD-methods. The total thickness is <2.0 μm. The total thickness of layers A+B+C+D+E is from about 2.0 to about 9.0 μm.

Alternatively, the body is coated with a first (innermost) layer (A) of $TiC_xN_yO_z$ with x+y+z≦1, preferably y>x and z<0.2, most preferably y>0.8 and z=0, with equiaxed grains with size less than about 0.5 μm and a total thickness less than about 1.5 μm but greater than about 0.1 μm using known chemical vapor deposition, CVD, methods.

a layer of $TiC_xN_yO_z$(B) with x+y+z≦1, preferably with z=0, x>0.3 and y>0.3 with a thickness of from about 1.5 to about 5.0 μm, preferably from about 2.0 to about 4.5 μm with columnar grains, using preferably a moderate temperature CVD, MTCVD, technique (using acetonitrile as the carbon and nitrogen source for forming the layer in the temperature range of from about 700° C. to about 900° C.). The exact conditions depend to a certain extent on the design of the equipment used.

a layer of $TiC_xN_yO_z$(C) with x+y+z≦1, preferably y>x and z<0.2, most preferably y>0.8 and z=0, with equiaxed grains with size less than about 0.5 μm and a total thickness less than about 1.5 μm but greater than about 0.1 μm using known CVD-methods. This layer (C) is as a second embodiment omitted.

The total thickness of the layers A+B+C is from about 1.5 to about 6.5 μm, preferably from about 2.0 to about 5.5 μm. Preferably, the layers A and C are each thinner than layer B.

an α- or κ-$Al_2O_3$-layer (D) with total thickness from about 1.5 to about 5.0 μm, preferably from about 1.5 to about 4.0 μm.

preferably, an outermost layer system (E) consisting of one or several layers in sequence of $TiC_xN_y$ (x+y≦1) using known CVD-methods. The total thickness is less than about 2.0 μm.

The total thickness of layers A+B+C+D+E is from about 3.0 to about 11.0 μm.

The coating is mechanically post-treated to expose the multilayer or the $Al_2O_3$-layer along the edge line by a brushing, blasting, grinding operation or combinations thereof such that the areas on the rake and flank face with chip and work piece contact respectively have been treated.

In the preferred method, two nylon brushes containing SiC grains are used with settings and insert positioning such that one brush mainly brushes the rake face and the other mainly the flank face to achieve the desired properties on the flank and rake face of the insert.

Figure 21:
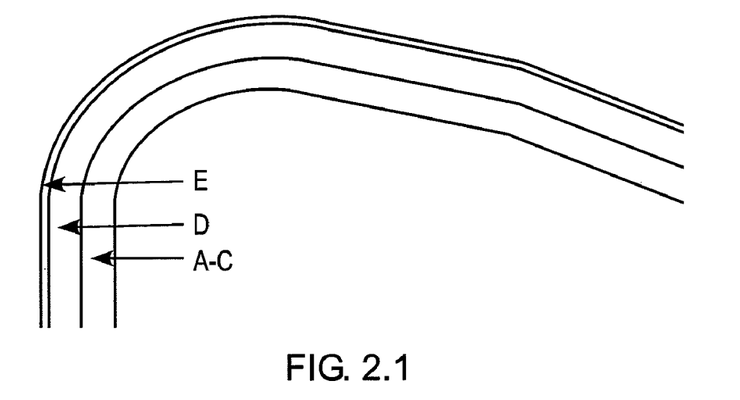
Figure 23:
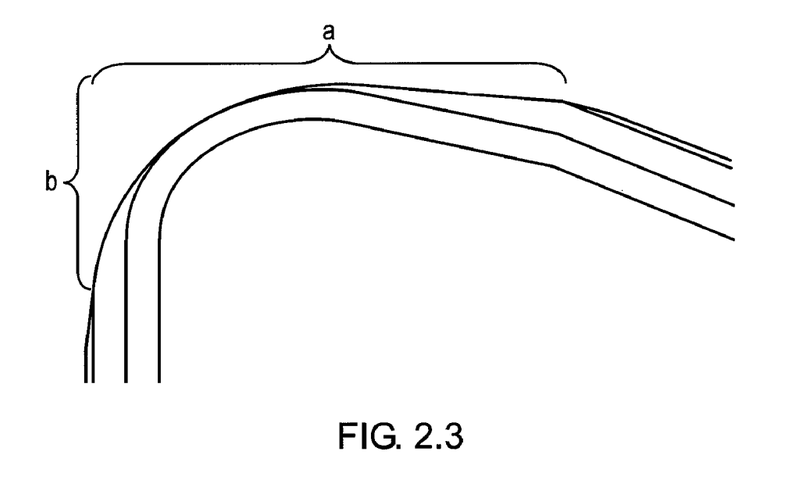

The removal of the outermost layer (E) at the edge-line will expose the $Al_2O_3$ layers along the edge line. The edge-line is defined as the edge-honed portion of the cutting tool insert. The untreated edge-line is illustrated in FIG. 2.1 and the post-treated edge-line is illustrated in FIG. 2.2 and 2.3. It is preferable that only the non-oxide top-layer and parts of the multilayer are removed. The $TiC_xN_yO_z$ layers (A+B+C) may, however, be visible on minor parts of the edge line (FIG. 2.3).

Alternatively, the coating is mechanically post-treated to expose the $Al_2O_3$ layer along the cutting edge by a brushing, blasting, grinding operation or combinations thereof such that the areas on the rake face with chip and work piece contact have been treated. In the preferred method for the alternative coating, blasting with $Al_2O_3$ grains with settings and insert positioning is used such that blasting is mainly done on the rake face. The removal of the outermost layer (E) at the rake face will expose the α-$Al_2O_3$ layer on the cutting edge in particular and fully or partly on the rake face.

The invention is additionally illustrated in connection with the following Examples which are to be considered as illustrative of the present invention. It should be understood, however, that the invention is not limited to the specific details of the Examples.

EXAMPLES

The following inserts and examples are selected to exemplify advantages of the invention.

The presented inserts have been tested with identical conditions in each example.

Insert A1. Cemented carbide turning inserts according to the invention having 6.0 wt % Co, 1.0 wt % Ti, 0.4 wt % Nb, 3.3 wt % Ta (Ti/(Ti+Ta+Nb)=0.21), 0.05 wt % N and balance made up by WC and with an average grain size of 2.8 μm and with a binder phase enriched and cubic carbide free zone with a depth of 15 μm were coated with 0.5 μm TiN (innermost layer), 2.2 μm columnar Ti(C,N), and 0.5 μm equiaxed TiN, 2.2 μm (κ-$Al_2O_3$+TiN)$_6$κ-$Al_2O_3$ multilayer and an outermost layer of 0.5 μm TiN+TiC+TiN.

The coating was post-treated along the edge line with nylon brushes containing SiC grains. The outermost coating was removed a=0.1 mm and b=0.05 mm into the rake and flank face.

Insert A2. Cemented carbide turning inserts according to the invention having 6.0 wt % Co, 1.0 wt % Ti, 0.4 wt % Nb, 3.3 wt % Ta (Ti/(Ti+Ta+Nb)=0.21), 0.05 wt % N and balance made up by WC and with an average grain size of 2.8 μm and with a binder phase enriched and cubic carbide free zone 15 μm from the surface were coated with 0.5 μm TiN (innermost layer), 3.7 μm columnar Ti(C,N), and 0.4 μm equiaxed Ti(C, N), 2.2 μm α-$Al_2O_3$ layer and an outermost layer of 0.8 μm sequenced TiN—TiC.

The coating was blasted with $Al_2O_3$ grains on the rake face particularly along the cutting edge.

Insert B1. Cemented carbide turning inserts according to the invention having 6.0 wt % Co, 1.0 wt % Ti, 0.4 wt % Nb, 3.3 wt % Ta (Ti/(Ti+Ta+Nb)=0.21), 0.05 wt % N and balance made up by WC and with an average grain size of 2.3 μm and with a binder phase enriched and cubic carbide free zone 15 μm from the surface were coated with 0.5 μm TiN (innermost layer), 2.2 μm columnar Ti(C,N), and 0.5 μm equiaxed TiN, 2.2 μm (κ-$Al_2O_3$+TiN)$_6$κ-$Al_2O_3$ multilayer and an outermost layer of 0.5 μm TiN+TiC+TiN.

The coating was post-treated along the edge line with nylon brushes containing SiC grains. The outermost coating was removed a=0.1 mm and b=0.05 mm into the rake and flank face.

Insert B2. Cemented carbide turning inserts according to the invention having 6.0 wt % Co, 1.0 wt % Ti, 0.4 wt % Nb, 3.3 wt % Ta (Ti/(Ti+Ta+Nb)=0.21), 0.05 wt % N and balance made up by WC and with an average grain size of 2.3 μm and with a binder phase enriched and cubic carbide free zone 15 μm from the surface were coated with 0.5 μm TiN (innermost layer), 3.7 μm columnar Ti(C,N), and 0.4 μm equiaxed TiN, 2.2 μm α-Al$_2$O$_3$ layer and an outermost layer of 0.8 μm sequenced TiN—TiC.

The coating was blasted with Al$_2$O$_3$ grains on the rake face particularly along the cutting edge.

Insert C. Commercial cemented carbide turning inserts having a substrate the composition of which is 6.2 wt % Co, 2.3 wt % Ti, 2.0 wt % Nb, 0.1 wt % Ta (Ti/(Ti+Ta+Nb)=0.52), 0.14 wt % N and balance made up by WC. The average WC grain size is 2.7 μm and the substrate further has a binder phase enriched and γ-phase free zone extending to a depth of 26 μm from the surface. The coating consists of a 0.1 μm TiN innermost layer, 4.0 μm columnar Ti(C,N), 0.3 μm equiaxed TiN, 1.9 μm κ-Al$_2$O$_3$ and an outermost layer of 0.3 μm TiN.

Insert D. Commercial cemented carbide turning inserts having a substrate the composition of which is 6.0 wt % Co, 2.1 wt % Ti, 0.4 wt % Nb, 3.3 wt % Ta (Ti/(Ti+Ta+Nb)=0.36), 0.09 wt % N and balance made up by WC. The average WC grain size is 2.4 μm and the substrate further has a binder phase enriched and γ-phase free zone extending to a depth of 13 μm from the surface. The coating consists of a 0.5 μm TiN innermost layer, 3.0 μm columnar Ti(C,N), 0.3 μm equiaxed TiN, 1.7 μm κ-Al$_2$O$_3$ and an outermost layer of 0.3 μm TiN.

Insert E. Commercial cemented carbide turning inserts having 7.5 wt % Co, 2.72 wt % Ta, 0.44 wt % Nb, 1.83 wt % Ti (Ti/(Ti+Ta+Nb)=0.37), 0.09 wt % N and balance made up by WC and with an average grain size of 2.0 μm and with a binder phase enriched and cubic carbide free zone 26 μm from the surface were coated with 0.5 μm TiN (innermost layer), 7.5 μm columnar Ti(C,N), 1.2 μm α+κ-Al$_2$O$_3$ and an outermost layer of 1.0 μm TiN.

The coating was post-treated along the edge line with nylon brushes containing SiC grains. The outermost coating was removed b=0.1 mm into the flank face.

Insert F. Commercial cemented carbide turning inserts having 8.75 wt % Co, 1.15 wt % Ta, 0.27 wt % Nb, (Ti/(Ti+Ta+Nb)=0), 0.09 wt % N and balance made up by WC and with an average grain size of 2.0 μm were coated with 0.5 μm TiN (innermost layer), 2.2 μm columnar Ti(C,N), and 0.5 μm equiaxed TiN, 2.2 μm (κ-Al$_2$O$_3$+TiN)$_6$κ-Al$_2$O$_3$ multilayer and an outermost layer of 0.5 μm TiN+TiC+TiN.

The coating was post-treated along the edge line with nylon brushes containing SiC grains. The outermost coating was removed a=0.1 mm and b=0.05 mm into the rake and flank face.

Example 1

Inserts from A1, A2 and E were tested in a turning operation.

Operation: External axial and facing of bar

Work piece material: Austenitic stainless steel, AISI304L

| Cutting Speed: | 270 m/min |
| --- | --- |
| Feed rate: | 0.3 mm/rev |
| Depth of cut: | 2 mm |
| Insert style: | CNMG120408-MM |
| Results: | Tool life |
| Insert A1: (invention) | 9 min |
| Insert A2: (invention) | 9 min |
| Insert E: (prior art) | 5 min |

Comment: Tool life criterion was maximum flank wear 0.3 mm of the cutting edge line. The wear develops irregularly due to local plastic deformation. This example shows the improvement in plastic deformation resistance for the inserts of the invention.

Example 2

Inserts from B1, B2 and E were tested in a turning operation.

Operation: Axial and facing operation of bar

Work piece material: Austenitic stainless steel, AISI304L

| Cutting speed: | 290 m/min |
| --- | --- |
| Feed rate: | 0.2 mm/rev |
| Depth of cut: | 2 mm |
| Insert style: | CNMG 120408-MM |
| Results: | Tool life |
| Insert B1: (invention) | 17 min |
| Insert B2: (invention) | 17 min |
| Insert E: (prior art) | 8 min |

Comment: Tool life criterion was maximum flank wear 0.3 mm of the cutting edge line. The wear develops irregularly due to local plastic deformation. This example shows the improvement in plastic deformation resistance for the inserts of the invention.

Example 3

Inserts from B1, D and E were tested in a turning operation.

Operation: Axial and facing against shoulder

Work piece material: Austenitic stainless steel, AISI304L

| Cutting speed: | 270 m/min |
| --- | --- |
| Feed rate: | 0.3 mm/rev |
| Depth of cut: | 2 mm |
| Insert styles: | CNMG 120408-MM |
| Results: | Edge damage |
| Insert B1: (invention) | 0.2 mm/min |
| Insert D: (prior art) | 0.9 mm/min |
| Insert E: (prior art) | 0.2 mm/min |

Comment: The test is focused on induced damage of the edge outside the direct area of contact between the tool and the workpiece, normally denoted chip hammering and chip jamming. The resistance of such damages is directly related to the edge toughness.

The insert of the invention shows improvements in these respects. The edge toughness is increased (inserts B1 and D) or maintained (inserts B1 and E) while the plastic deformation resistance is increased (example 2).

Example 4

Inserts from A1 and C were tested in a turning operation.

Operation: Facing towards center

Work piece material: Austenitic stainless steel, AISI304L

| Cutting speed: | 180 m/min |
| --- | --- |
| Feed rate: | 0.30 -> 0.15 mm/rev |
| Depth of cut: | 1 mm |
| Insert style: | CNMG 120408-MM |
| Results: | Tool life |
| Insert A1: (invention) | 5 min |
| Insert C: (prior art) | 3 min |

Comment: This is an operation that demands edge toughness and the test shows clear improvement of the insert of the invention compared to prior art insert. It is however difficult in this example to identify one single critical wear factor but it can be described as a combination of wear due to chipping, flaking of the coating on the rake face and adhesive wear.

Example 5

Inserts from B1, B2 and E were tested in a turning operation.

Operation: Profiling of shaft

Work piece material: Austenitic stainless steel, AISI316L

| | |
|---|---|
| Cutting speed: | 200 m/min |
| Feed rate: | 0.25 mm/rev |
| Depth of cut: | 3 mm |
| Insert style: | TNMG 160408-MM |
| Results: | Tool life |
| Insert B1: (invention) | 14 pcs |
| Insert B2: (invention) | 15 pcs |
| Insert E: (prior art) | 9 pcs |

Comment: This test shows improvement in edge toughness for the inserts of the invention compared to the prior art insert. Edge line chipping and notch wear occur earlier for the insert of prior art.

Example 6

Inserts from A1, E and F were tested in a turning operation.

Operation: Facing of a shaft

Work piece material: Austenitic stainless steel, AISI304L

| | |
|---|---|
| Cutting speed: | 180 m/min |
| Feed rate: | 0.30 -> 15 mm/rev |
| Depth of cut: | 1 mm |
| Insert style: | CNMG 120408-MM |
| Results: | Tool life |
| Insert A1: (invention) | 6.5 min |
| Insert E: (prior art) | 2.5 min |
| Insert F: (prior art) | 5.5 min |

Comment: This example shows that the insert of the invention has increased edge toughness. It is in this example hard to identify one single critical wear factor but it can be described as a combination of wear due to chipping, flaking of coating on the rake face and adhesive wear.

Example 7

Inserts from B1 and E were tested in a turning operation.

Operation: Combined longitudinal and facing of small bar

Work piece material: Austenitic stainless steel, AISI304L

| | |
|---|---|
| Cutting speed: | 250 m/min |
| Feed rate: | 0.4 mm/rev |
| Depth of cut: | 2 mm |
| Insert style: | CNMG 120408-MM |
| Results: | Tool life |
| Insert B1: (invention) | 8 min |
| Insert E: (prior art) | 4 min |

Comment: Main wear mechanisms are plastic deformation and adhesive wear. This example shows improvement in resistance regarding both these mechanisms for the insert of invention compared to the prior art insert.

Example 8

Inserts from B1 and E were tested in a turning operation.

Operation: Continuous cutting of a forged component

Work piece material: Austenitic stainless steel, SS2343

| | |
|---|---|
| Cutting speed: | 200 m/min |
| Feed rate: | 0.17-0.27 mm/rev |
| Depth of cut: | 0.1-1.3 mm |
| Insert style: | CNMG120408-MM |
| Results: | Tool life |
| Insert B1: (invention) | 1500 pcs |
| Insert E: (prior art) | 200 pcs |

Comment: The critical wear criteria are flaking, built-up edge and chipping. The insert of invention shows improved resistance against these wear types compared to the prior art insert.

In conclusion, it can be stated that from the result of the examples given above it is evident that by combining a cemented carbide substrate with the given composition, the selection of the multilayered or $Al_2O_3$-coating with specific thicknesses and the special edge treatment, a tool insert has been created with excellent cutting performance in that it combines much of what was believed to be contradictory properties as described in the introduction.

The principles, preferred embodiments, and modes of operation of the present invention have been described in the foregoing specification. The invention which is intended to be protected herein, however, is not to be construed as limited to the particular forms disclosed, as these are to be regarded as illustrative rather than restrictive. Variations and changes may be made by those skilled in the art without departing from the spirit of the invention.

The invention claimed is:

1. A method of making a coated cemented carbide cutting tool insert comprising a cemented carbide substrate from about 5.0 to less than about 8.0 wt % Co, from about 3.0 to about 8.0 wt % cubic carbides of the metals Ti, Ta and Nb and possibly other carbides of the elements from group IVb, Vb or VIb of the periodic table, the addition of cubic carbide forming elements being such that the Ti/(Ti+Ta+Nb) ratio is from about 0.05 to about 0.3, from about 0.01 to about 0.2 wt % N and balance tungsten carbide (WC) having a grain size of from about 1.5 to about 3.5 μm in the as-sintered state, comprising sintering said substrate in vacuum after the addition of a small amount of nitrogen to form a cubic carbide depleted and binder phase enriched zone near the surface;
   coating said body with a first, innermost layer system of at least two layers of $TiC_xN_yO_z$ with $x+y+z \leq 1$; and
   a second multilayer system comprising from about 5 to about 31 alternating layers of $Al_2O_3$ and $TiC_xN_yO_z$ ($x+y+z \leq 1$), the $Al_2O_3$-layers having an individual layer thickness of less than about 0.6 μm and the $TiC_xN_yO_z$-layers from about 0.01 to about 0.2 μm with a total thickness of the multilayer from about 1.0 to about 5.0 μm,
   exposing said multilayer along the edge line and into the rake and flank face, such that the exposure on the rake face a is greater than about 0.03 and less than about 0.9 mm, the exposure on the flank face b is greater than about 0.02 and less than about 0.2 mm and a>b.

2. The method of claim 1 wherein the said substrate of cemented carbide has a composition comprising from about 5.0 to less than about 7.0 wt % Co, from about 4.0 to about 7.0 wt % cubic carbides of the metals Ti, Ta and Nb and possibly other carbides of the elements from group IVb, Vb or VIb of the periodic table, the addition of cubic carbide forming elements being such that the Ti/(Ti+Ta+Nb) ratio is from about 0.1 to about 0.25, from about 0.01 to about 0.2 wt % N and balance tungsten carbide (WC) having a grain size of from about 2.0 to about 3.0 μm in the as-sintered state and having a γ-phase depleted and binder phase enriched surface zone which has a depth of 5-25 μm.

3. The method of claim 1 wherein the said second multilayer system comprises from about 11 to about 15 alternating layers of κ-$Al_2O_3$ and TiN, the κ-$Al_2O_3$-layers having an individual layer thickness of from about 0.2 to about 0.5 μm and the TiN layers from about 0.02 to about 0.15 μm with a total thickness of the multilayer from about 1.5 to 4.0 μm.

4. The method of claim 1 wherein the innermost layer system of the coating comprises
a first layer $TiC_xN_yO_z$ with $x+y+z \leq 1$ with equiaxed grains with a size less than about 0.5 μm and a total thickness less than about 1.5 μm but greater than about 0.1 μm, preferably from about 0.1 to about 0.6 μm
a second layer of $TiC_xN_yO_z$ with $x+y+z \leq 1$ with a thickness of from about 0.4 to about 4.9 μm.

5. The method of claim 1 wherein the total thickness of the innermost layer system of the coating is from about 0.7 to about 5.5 m.

6. The method of claim 5 wherein the said total thickness is from about 1.2 to about 5.0 μm.

7. The method of claim 1 further comprising coating said body with an outermost layer system on top of the multilayer of one or more layers of $TiC_xN_y$ ($x+ \leq 1$).

8. The method of claim 1 further comprising exposing the multilayer and partly the innermost $TiC_xN_yO_z$ layer system along the edge line.

\* \* \* \* \*